United States Patent
Fath et al.

(10) Patent No.: US 8,182,706 B2
(45) Date of Patent: May 22, 2012

(54) METHOD FOR TEXTURING SILICON WAFERS FOR PRODUCING SOLAR CELLS

(75) Inventors: Peter Fath, Deutschland (DE); Ihor Melnyk, Deutschland (DE); Eckard Wefringhaus, Deutschland (DE)

(73) Assignee: Universitat Konstanz, Constance (DE)

( * ) Notice: Subject to any disclaimer, the term of this patent is extended or adjusted under 35 U.S.C. 154(b) by 423 days.

(21) Appl. No.: 12/438,009

(22) PCT Filed: Jul. 12, 2007

(86) PCT No.: PCT/EP2007/006172
§ 371 (c)(1),
(2), (4) Date: Mar. 13, 2009

(87) PCT Pub. No.: WO2008/022671
PCT Pub. Date: Feb. 28, 2008

(65) Prior Publication Data
US 2009/0246969 A1 Oct. 1, 2009

(30) Foreign Application Priority Data
Aug. 19, 2006 (EP) .................................. 06017318

(51) Int. Cl.
*B29D 11/00* (2006.01)
*H01L 21/302* (2006.01)
*H01L 21/461* (2006.01)
(52) U.S. Cl. .......................................... 216/24; 438/753
(58) Field of Classification Search .................... 216/24; 438/753
See application file for complete search history.

(56) References Cited

U.S. PATENT DOCUMENTS

| 4,348,254 A * | 9/1982 | Lindmayer ..................... 438/71 |
| 4,918,030 A | 4/1990 | Lamb et al. |
| 6,207,890 B1 | 3/2001 | Nakai et al. |
| 7,858,426 B2 * | 12/2010 | Cheong et al. ................. 438/57 |
| 2001/0029978 A1 * | 10/2001 | Nakai et al. .................... 136/258 |
| 2004/0112426 A1 | 6/2004 | Hagino |
| 2004/0259335 A1 * | 12/2004 | Narayanan et al. ............ 438/584 |

FOREIGN PATENT DOCUMENTS

| DE | 2952431 | 7/1981 |
| DE | 69811511 | 3/1998 |

OTHER PUBLICATIONS

Vazsonyi et al. "Improved anisotropic etching process for industrial texturing of silicon slar cells" Feb. 26, 1999 Solar Energy Materials and Solar Cells, Elsevier Science Publishers, 57, p. 180-184.*
Divan et al. "Roughning and smoothing dynamics during KOH silicon etching" Apr. 20, 1999 Sensors and Actuators, Elsevier Science Publishers, 74, p. 19-22.*

(Continued)

*Primary Examiner* — Parviz Hassanzadeh
*Assistant Examiner* — Margaret D Klunk
(74) *Attorney, Agent, or Firm* — Faegre Baker Daniels

(57) ABSTRACT

In a method for texturing silicon wafers for producing solar cells, the step of introducing a silicon wafer involves the use of a texturing solution which is at a temperature of at least 80 degrees Celsius and which comprises water admixed with 1 percent by weight to 6 percent by weight KOH or 2 percent by weight to 8 percent by weight NaOH and with a surfactant or a surfactant mixture constituting less than 0.01 percent by weight. Very economic texturing can be performed in this way.

24 Claims, 1 Drawing Sheet

OTHER PUBLICATIONS

Lang "Silicon microstructuring technology" Sep. 1996 Materials Science and Engineering, Elsevier Science Publishers, R17, 1-10.*
CRC Handbook of Chemistry and Physics, 91st Ed "Concentrative properties of aqueous solutions: density, refractive index, freezing point depression, and viscosity" 2011 p. 8-71.*
International Preliminary Report on Patentability for PCT/US2008/003483 issued by the European Patent Office on Mar. 26, 2009 (5 pgs.).
International Search Report for International Application No. PCT/EP2007/006172, 11 pages.
Vazonyi E et al. "Improved Anisotropic Etching Process for Industrial Texturing of Silicon Solar Cells—An Introduction to Design, Data Analysis and Model Building" Solar Energy Mateials and Solar Cells Elsevier Science Publishers, Amsterdam, Feb. 26, 1999, 179-188, EP004157015, ISSN: 0927-0248 ( ).

* cited by examiner

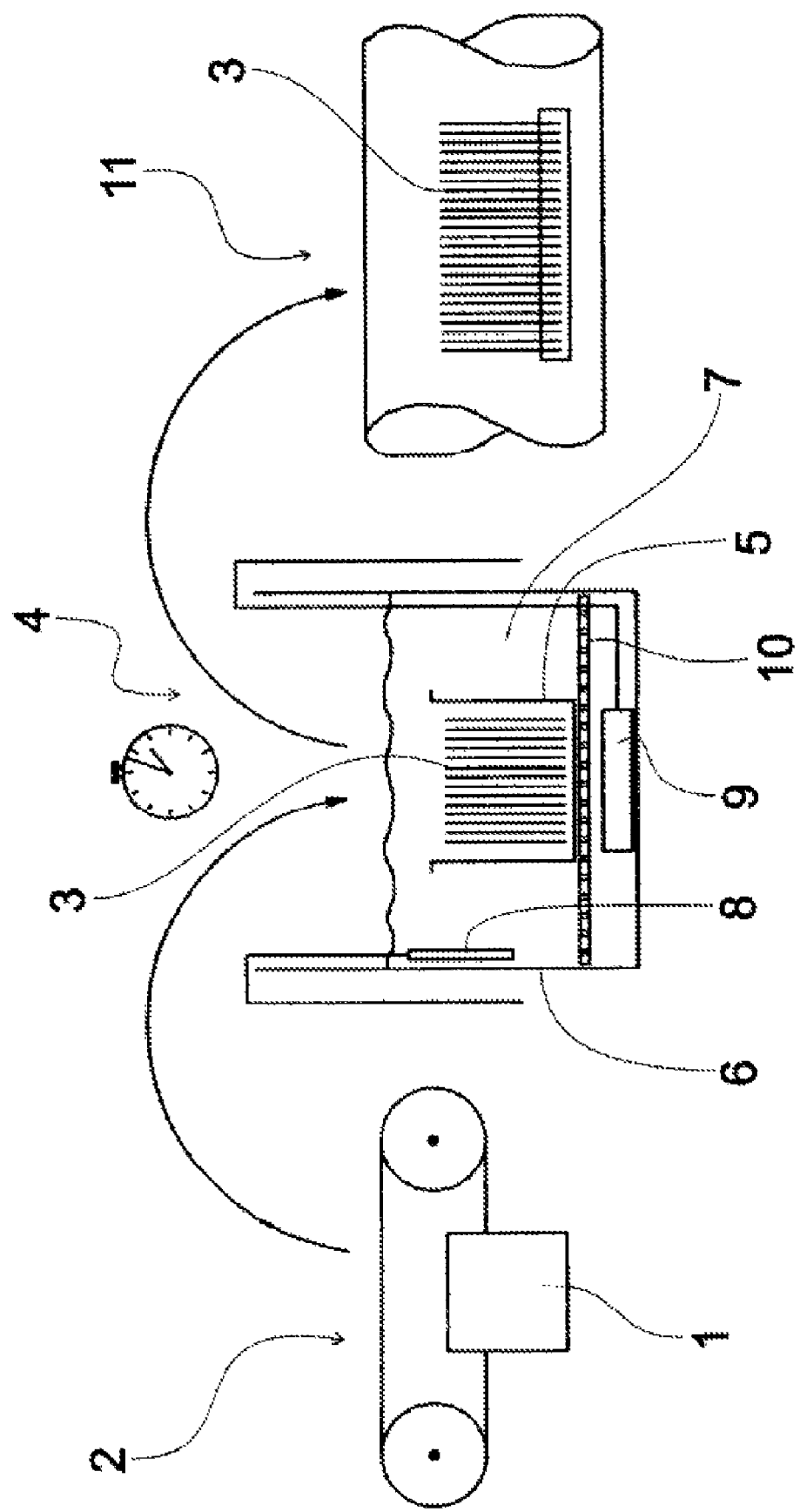

METHOD FOR TEXTURING SILICON WAFERS FOR PRODUCING SOLAR CELLS

CROSS-REFERENCE TO RELATED APPLICATIONS

The present application claims priority to International Application No. PCT/EP2007/006172 filed Jul. 12, 2007, which claims priority to European Patent Application No. 06017318.4 filed Aug. 19, 2006. The contents of both applications are expressly incorporated herein by reference in their entireties.

FIELD OF THE INVENTION

The invention is directed to a method for texturing silicon wafers for producing solar cells.

BACKGROUND

A method for texturing silicon wafers for producing solar cells is known, for example, from DE 698 11 511 T2. In the prior method, the silicon wafer is introduced into a texturing solution containing water, an alkaline solution of 0.01 to 8 percent by weight NaOH or 3 percent by weight to 6 percent by weight KOH and a surface-active agent (Sintrex, manufactured by Nippon Oil and Fat Company, Ltd.), which is preferably added in a ratio of more than 1 percent by weight. The surface-active agent can be replaced with an isopropyl alcohol, in which case the texturing typically takes place at a temperature of about 85 degrees Celsius.

SUMMARY

The object underlying the invention is to specify a method for texturing silicon wafers for producing solar cells that is comparatively economical.

This object is achieved, in a method for texturing silicon wafers for producing solar cells, by the fact that in the step of introducing a silicon wafer into a texturing solution, the texturing solution is at a temperature of at least 80 degrees Celsius and comprises water admixed with 1 percent by weight to 6 percent by weight KOH or 2 percent by weight to 8 percent by weight NaOH and with a surfactant or a surfactant mixture constituting less than 0.01 percent by weight.

The texturing solution is free of any other constituents or additives.

According to the invention, the concentration of surfactants or surfactant mixtures in the texturing solution is extremely low, such that undesirable characteristics that may develop at the relatively high process temperature, for example foaming, are not a factor, while at the same time a relatively high etching rate that permits economic texturing is obtained.

In one exemplary embodiment of the invention, it is useful for the texturing solution to contain a surfactant or a surfactant mixture constituting less than 0.005 percent by weight.

In a further exemplary embodiment of the invention, the concentration of surfactant or surfactant mixture is even less than 0.001 percent by weight.

Advantageous concentrations of KOH are 3 percent by weight to 5 percent by weight, and of NaOH, 4 percent by weight to 6 percent by weight.

In advantageous implementation, the temperature of the texturing solution is at least 90 degrees Celsius, preferably 95 degrees Celsius and particularly preferably at least 97 degrees Celsius.

BRIEF DESCRIPTION OF THE DRAWING

The invention will be described in more detail below with reference to exemplary embodiments.

FIG. 1 presents the typical layout of a system which has been used to process silicon wafers in the context of the exemplary embodiments and incorporating the method according to the invention.

DETAILED DESCRIPTION

A silicon die 1, a so-called "ingot," was sawed into individual silicon wafers 3 at a sawing station 2. During the execution of the method according to the invention, the silicon wafers 3 are situated in a texturing station 4, as a stack in a wafer holder 5 disposed in a texturing-solution tank 6. The texturing-solution tank 6 is filled with a texturing solution 7 to a sufficient extent that the silicon wafers 3 are completely submerged in the texturing solution 7. The temperature of the texturing solution 7 is measured by means of a temperature sensor 8 that stays in thermal contact with the texturing solution 7, while the temperature is influenced by means of a heating element 9 that is also submerged in the texturing solution 7. A perforated plate 10 is disposed between the heating element 9 and the wafer holder 5. After the method of the invention has been carried out in this texturing station 4, the silicon wafers 3 are routed to a diffusion station 11, in which they are processed further to produce solar cells.

The alkaline solution used in all the exemplary embodiments described below was KOH, Semiconductor Grade Puranal® (Honeywell 17851).

All the exemplary embodiments employ monocrystalline silicon wafers ((100) Cz, as-cut, p-type (boron), 125 mm×125 mm, 150 mm diameter, thickness 300 µm) manufactured by M. Setek (0.8-2.0 ohm-cm) or Deutsche Solar (0.5-1.7 ohm-cm). The silicon wafers were used "as sawed." Sawing damage was not removed. It is understood, however, that the silicon wafers can also be etched or put through an isotexturing treatment to remove sawing damage before the method according to the invention is performed.

The values for reflection as a characteristic value indicative of photovoltaic conversion efficiency typically vary around approximately 1% absolute.

"Reiny" Dishwashing Liquid Concentrate

This exemplary embodiment involves the use of a household dishwashing liquid concentrate (tradename "Reiny") containing less than 5 percent by weight nonionic surfactants, amphoteric surfactants, and more than 30 percent by weight anionic surfactants.

The other parameters and the results of an exemplary performance of the method according to the invention can be found in the following table.

TABLE 1

| ("Reiny" dishwashing liquid concentrate) | | | | |
|---|---|---|---|---|
| Surfactant wt.-% | KOH wt.-% | Temperature degrees Celsius | Time min | Reflection % |
| None | 2 | ≈98 | 10 | 16.6 |
| 0.001 | 3 | ≈98 | 10 | 11.4 |

It can be seen from Table 1 that in the comparison test where no surfactant was used, reflection was 50% higher than with the use of the dishwashing liquid concentrate having a concentration of 0.001 percent by weight. Thus, even with this very low concentration of surfactant or surfactant mixture, a substantial effect in terms of improving photovoltaic conversion efficiency can be expected. The aim in this regard is to obtain a reflection value of less than 13%, preferably of appreciably less than 12.5%.

"M14" Cleaner

The surfactant mixture used in this exemplary embodiment was a commercially available cleaner with the designation "M14," manufactured by Martin & Co., Freiburg, Germany, and essentially composed of 5 percent by weight to 15 percent by weight anionic surfactants, nonionic surfactants, preservatives and amides.

Typical parameters and the texturing results are compiled in the following table.

TABLE 2

("M14" cleaner)

| Surfactant wt.-% | KOH wt.-% | Temperature degrees Celsius | Time min | Reflection % |
|---|---|---|---|---|
| Reference, "as-cut" | | | | 27.0 |
| None | 4 | 80 | 10 | 31.2 |
| 0.00075 | 3 | ≈98 | 25 | 12.7 |
| 0.001 | 4 | ≈98 | 10 | 11.1 |
| 0.0015 | 4 | ≈98 | 15 | 12.7 |
| 0.0022 | 4 | ≈98 | 15 | 12.9 |
| 0.003 | 4 | ≈98 | 10 | 13.7 |
| 0.0032 | 5 | ≈98 | 10 | 11.1 |
| 0.0045 | 5 | ≈98 | 15 | 12.3 |

Here again, the method of the invention generally yields acceptable reflection values. The improvement in reflection compared to the untreated silicon wafer after sawing (reference, "as-cut") and etching without a surfactant is clearly apparent.

ALO

The surfactant or surfactant mixture used in this exemplary embodiment was Ammonyx LO (lauryl-myristyl dimethylamine oxide in aqueous solution, 30.1% dodecyl-dimethylamine oxide), cationic, Goldschmidt AG Essen, batch PA127A0077.

TABLE 3

("ALO")

| Surfactant wt.-% | KOH wt.-% | Temperature degrees Celsius | Time min | Reflection % |
|---|---|---|---|---|
| 0.002 | 4 | 97-98 | 10 | 13.3 |
| 0.0035 | 4 | 97-98 | 20 | 12.2 |
| 0.005 | 4 | 97-98 | 30 | 11.6 |

TEC

The surfactant or surfactant mixture used in this exemplary embodiment was Tegotens EC 11 (end-group-closed fatty alcohol ethoxylate), nonionic, Goldschmidt AG Essen, batch ES993200616.

TABLE 4

("TEC")

| Surfactant wt.-% | KOH wt.-% | Temperature degrees Celsius | Time min | Reflection % |
|---|---|---|---|---|
| 0.00015 | 3 | 97-98 | 10 | 17.1 |
| 0.00015 | 3 | 97-98 | 15 | 13.6 |
| 0.00015 | 3 | 97-98 | 20 | 12.6 |
| 0.00015 | 3 | 97-98 | 20 | 12.7 |
| 0.00015 | 3 | 97-98 | 20 | 13.0 |
| 0.00015 | 3 | 97-98 | 30 | 11.8 |
| 0.00015 | 3 | 97-98 | 30 | 12.3 |
| 0.00015 | 3 | 97-98 | 30 | 13.3 |
| 0.0002 | 3 | 97-98 | 20 | 12.3 |
| 0.0003 | 4 | 97-98 | 30 | 11.9 |
| 0.0004 | 4 | 97-98 | 30 | 12.6 |
| 0.0005 | 5 | 97-98 | 20 | 12.7 |
| 0.0005 | 5 | 97-98 | 30 | 13.1 |
| 0.0006 | 5 | 97-98 | 20 | 12.7 |
| 0.0006 | 5 | 97-98 | 30 | 13.3 |
| 0.0006 | 6 | 97-98 | 20 | 12.3 |

It can be seen from Table 4 that as the texturing times increase, the reflection value no longer changes substantially after a certain time. The variations in reflection under identical test conditions are also apparent here.

It can further be appreciated from Table 4 that satisfactory reflection values are obtained with concentrations of surfactants or surfactant mixtures ranging from less than 0.001 percent by weight.

REWO

The surfactant or surfactant mixture used in this exemplary embodiment was Rewoteric AM 2 C NM (a 40% aqueous solution of N-coconut fatty acid amidoethyl-N-2-hydroxyethylglycinate, sodium salt), amphoteric, Goldschmidt AG Essen, batch ST04219293.

TABLE 5

("REWO")

| Surfactant wt.-% | KOH wt.-% | Temperature degrees Celsius | Time min | Reflection % |
|---|---|---|---|---|
| 0.0002 | 2 | 97-98 | 20 | 12.3 |
| 0.0005 | 2 | 97-98 | 20 | 12.4 |
| 0.0010 | 2 | 97-98 | 20 | 12.4 |
| 0.0015 | 2 | 97-98 | 20 | 11.9 |
| 0.0020 | 3 | 97-98 | 20 | 12.4 |

TDO

The surfactant or surfactant mixture used in this exemplary embodiment was Tegotens DO (an aqueous solution of an alkyl dimethylamine oxide, 29.9% decyl dimethylamine oxide), cationic, Goldschmidt AG Essen, batch PA03500400.

TABLE 6

("TDO")

| Surfactant wt.-% | KOH wt.-% | Temperature degrees Celsius | Time min | Reflection % |
|---|---|---|---|---|
| 0.003 | 3 | 97-98 | 15 | 12.6 |
| 0.003 | 3 | 97-98 | 20 | 12.5 |
| 0.004 | 3 | 97-98 | 10 | 12.9 |
| 0.004 | 3 | 97-98 | 15 | 12.4 |
| 0.004 | 3 | 97-98 | 20 | 12.4 |
| 0.005 | 3 | 97-98 | 1 | 28.2 |

TABLE 6-continued ("TDO")

| Surfactant wt.-% | KOH wt.-% | Temperature degrees Celsius | Time min | Reflection % |
|---|---|---|---|---|
| 0.005 | 3 | 97-98 | 2 | 23.9 |
| 0.005 | 3 | 97-98 | 3 | 17.7 |
| 0.005 | 3 | 97-98 | 4 | 16.5 |
| 0.005 | 3 | 97-98 | 6 | 13.1 |
| 0.005 | 3 | 97-98 | 8 | 13.2 |
| 0.005 | 3 | 97-98 | 10 | 12.4 |
| 0.005 | 3 | 97-98 | 20 | 12.0 |

It can be seen especially clearly from Table 6 that at the concentration of 0.005 percent by weight, reflection decreases within a few minutes, reaching acceptable values after a texturing time of as little as 10 minutes.

TDO Comparison Test

The surfactant mixture "TDO" as specified above was used in a comparison test that involved approximating the surfactant concentrations at the lowest values, those which were identified as no longer suitable in DE 698 11 511 T2.

The material results are compiled in the following table.

TABLE 7

("ALO")

| Surfactant wt.-% | KOH wt.-% | Temperature degrees Celsius | Time min | Reflection % |
|---|---|---|---|---|
| 0.005 | 3 | 84-86 | 10 | 12.2 |
| 0.05 | 3 | 84-86 | 10 | 21.4 |
| 0.5 | 3 | 84-86 | 10 | 26.6 |

It can be appreciated from Table 7 that as the surfactant concentration increases to 0.5 percent by weight, reflection climbs to unacceptable values. If the temperature is increased, the high concentrations give rise to extremely detrimental foaming that is almost impossible to control with process engineering.

The effect according to the invention materializes at a surfactant concentration that is 1000 times lower than the preferred surfactant concentration ranges specified in DE 698 11 511 T2.

The invention claimed is:

1. A method for texturing silicon wafers for producing solar cells, comprising the step of introducing a silicon wafer into an aqueous texturing solution which is at a temperature of at least 80 degrees Celsius and which comprises:
   one of:
      1 percent by weight to 6 percent by weight KOH, and
      2 percent by weight to 8 percent by weight NaOH; and
   one of:
      at least 0.00015 and less than 0.005 percent by weight of a surfactant, and at least 0.00015 and less than 0.005 percent by weight of a surfactant mixture.

2. The method of claim 1, wherein said one of said surfactant and said surfactant mixture is present in an amount of at least 0.00015 and less than 0.001 percent by weight.

3. The method of claim 2, wherein said texturing solution contains 3 percent by weight to 5 percent by weight KOH.

4. The method of claim 2, wherein said texturing solution contains 4 percent by weight to 6 percent by weight NaOH.

5. The method of claim 1, wherein said temperature is at least 90 degrees Celsius.

6. The method of claim 1, wherein said temperature is at least 95 degrees Celsius.

7. The method of claim 1, wherein said temperature is at least 97 degrees Celsius.

8. The method of claim 1, wherein said texturing solution contains 3 percent by weight to 5 percent by weight KOH.

9. The method of claim 8, wherein said temperature is at least 90 degrees Celsius.

10. The method of claim 8, wherein said temperature is at least 95 degrees Celsius.

11. The method of claim 8, wherein said temperature is at least 97 degrees Celsius.

12. The method of claim 1, wherein said texturing solution contains 4 percent by weight to 6 percent by weight NaOH.

13. The method of claim 12, wherein said temperature is at least 90 degrees Celsius.

14. The method of claim 12, wherein said temperature is at least 95 degrees Celsius.

15. The method of claim 12, wherein said temperature is at least 97 degrees Celsius.

16. A method for texturing silicon wafers for producing solar cells, comprising the step of introducing a silicon wafer into an aqueous texturing solution which is at a temperature of at least 90 degrees Celsius and which comprises:
   1 percent by weight to 6 percent by weight KOH; and
   one of:
      at least 0.00015 and less than 0.005 percent by weight of a surfactant, and
      at least 0.00015 and less than 0.005 percent by weight of a surfactant mixture.

17. The method of claim 16, wherein said one of said surfactant and said surfactant mixture is present in an amount of at least 0.00015 and less than 0.001 percent by weight.

18. The method of claim 16, wherein said texturing solution contains 3 percent by weight to 5 percent by weight KOH.

19. The method of claim 16, wherein said temperature is at least 95 degrees Celsius.

20. The method of claim 16, wherein said temperature is at least 97 degrees Celsius.

21. A method for texturing silicon wafers for producing solar cells, comprising the step of introducing a silicon wafer into an aqueous texturing solution which is at a temperature of at least 95 degrees Celsius and which comprises:
   2 percent by weight to 8 percent by weight NaOH; and
   one of:
      at least 0.00015 and less than 0.005 percent by weight of a surfactant, and
      at least 0.00015 and less than 0.005 percent by weight of a surfactant mixture.

22. The method of claim 21, wherein said one of said surfactant and said surfactant mixture is present in an amount of at least 0.00015 and less than 0.001 percent by weight.

23. The method of claim 21, wherein said texturing solution contains 4 percent by weight to 6 percent by weight NaOH.

24. The method of claim 21, wherein said temperature is at least 97 degrees Celsius.

* * * * *